(12) United States Patent
Fujino et al.

(10) Patent No.: US 9,304,635 B2
(45) Date of Patent: Apr. 5, 2016

(54) CONDUCTIVE FILM

(71) Applicant: NITTO DENKO CORPORATION, Ibaraki-shi (JP)

(72) Inventors: Nozomi Fujino, Ibaraki (JP); Hiroyuki Takao, Ibaraki (JP)

(73) Assignee: NITTO DENKO CORPORATION, Ibaraki-shi (JP)

( * ) Notice: Subject to any disclaimer, the term of this patent is extended or adjusted under 35 U.S.C. 154(b) by 133 days.

(21) Appl. No.: 13/944,428

(22) Filed: Jul. 17, 2013

(65) Prior Publication Data
US 2014/0044942 A1   Feb. 13, 2014

(30) Foreign Application Priority Data

Aug. 9, 2012 (JP) .................................. 2012-176852

(51) Int. Cl.
*G06F 3/044* (2006.01)
*B32B 9/00* (2006.01)
*B32B 7/12* (2006.01)
*B32B 15/04* (2006.01)
(Continued)

(52) U.S. Cl.
CPC . *G06F 3/044* (2013.01); *B32B 7/12* (2013.01); *B32B 9/00* (2013.01); *B32B 15/04* (2013.01); *B32B 15/20* (2013.01); *B32B 27/06* (2013.01); *B32B 27/325* (2013.01); *C22C 9/00* (2013.01); *C22C 32/001* (2013.01); *C23C 14/086* (2013.01); *C23C 14/562* (2013.01); *B32B 2255/06* (2013.01); *B32B 2255/205* (2013.01); *B32B 2307/202* (2013.01); *B32B 2457/00* (2013.01); *B32B 2457/208* (2013.01); *C22C 14/00* (2013.01); *Y10T 428/24959* (2015.01); *Y10T 428/24967* (2015.01); *Y10T 428/26* (2015.01)

(58) Field of Classification Search
USPC ............................................ 428/214, 215, 332
See application file for complete search history.

(56) References Cited

U.S. PATENT DOCUMENTS 4,948,677 A   8/1990  Gillery
8,654,433 B2 *  2/2014  Baur ............................. 359/265
(Continued)

FOREIGN PATENT DOCUMENTS

CN    101697288 A    4/2010
JP    2011-060146 A  3/2011
(Continued)

OTHER PUBLICATIONS

Office Action dated May 2, 2014, issued in Corresponding Korean Patent Application No. 10-2013-0062012, with English Translation (13 pages).
(Continued)

*Primary Examiner* — Tahseen N Khan
(74) *Attorney, Agent, or Firm* — Westerman, Hattori, Daniels & Adrian, LLP

(57) ABSTRACT

A conductive film includes an elongated film base, a first conductive layer, a second conductive layer and a third conductive layer in this order. The elongated film base has a longitudinal direction and a width direction orthogonal to the longitudinal direction. The width direction dimension of the elongated film base is greater than or equal to 1 m. The first conductive layer is an indium-based oxide layer. The second conductive layer is a metal layer. The third conductive layer is an oxidized metal layer having a thickness of 1 nm to 15 nm formed by sputter deposition.

11 Claims, 2 Drawing Sheets

(51) Int. Cl.
- *B32B 15/20* (2006.01)
- *B32B 27/06* (2006.01)
- *B32B 27/32* (2006.01)
- *C22C 9/00* (2006.01)
- *C22C 32/00* (2006.01)
- *C23C 14/08* (2006.01)
- *C23C 14/56* (2006.01)
- *C22C 14/00* (2006.01)

(56) References Cited

U.S. PATENT DOCUMENTS

| | | | |
|---|---|---|---|
| 2002/0159270 A1* | 10/2002 | Lynam | B60K 35/00 362/492 |
| 2003/0035906 A1* | 2/2003 | Memarian et al. | 428/1.3 |
| 2004/0086717 A1 | 5/2004 | Sasaki et al. | |
| 2008/0212189 A1* | 9/2008 | Baur | B32B 17/10174 359/604 |
| 2010/0089621 A1* | 4/2010 | Stoss et al. | 174/254 |
| 2010/0252184 A1 | 10/2010 | Morimoto et al. | |
| 2012/0140080 A1* | 6/2012 | Taylor | B60C 23/0408 348/148 |
| 2013/0105301 A1 | 5/2013 | Yamazaki et al. | |
| 2013/0149555 A1* | 6/2013 | Yamazaki et al. | 428/697 |
| 2013/0248227 A1 | 9/2013 | Kim et al. | |

FOREIGN PATENT DOCUMENTS

| | | |
|---|---|---|
| JP | 2012-33484 A | 2/2012 |
| KR | 10-2010-0088155 A | 8/2010 |
| KR | 10-2012-0053480 A | 5/2012 |
| WO | 2012/005300 A1 | 1/2012 |

OTHER PUBLICATIONS

Taiwanese Office Action dated Sep. 11, 2014, issued in corresponding Taiwanese Application No. 102126543; W/English Translation. (8 pages).

Decision of Refusal dated Feb. 27, 2015, issued in corresponding Korean Patent Application No. 10-2013-0062012, with English translation (7 pages).

Korean Office Action dated Oct. 30, 2014, issued in corresponding Korean Patent Application No. 10-2013-0062012, w/English translation (6 pages).

Office Action dated May 28, 2015, issued in counterpart Chinese application No. 201310346726.6 (w/English translation) (17 pages).

Office Action dated Dec. 14, 2015, issued in counterpart Chinese Patent Application No. 201310346726.6 , with English Translation (18 pages).

Notification of Service of Certified Appeal Decision dated Dec. 30, 2015, issued in counterpart Korean Patent Application No. 10-2013-0062012, with English Translation (23 pages).

* cited by examiner

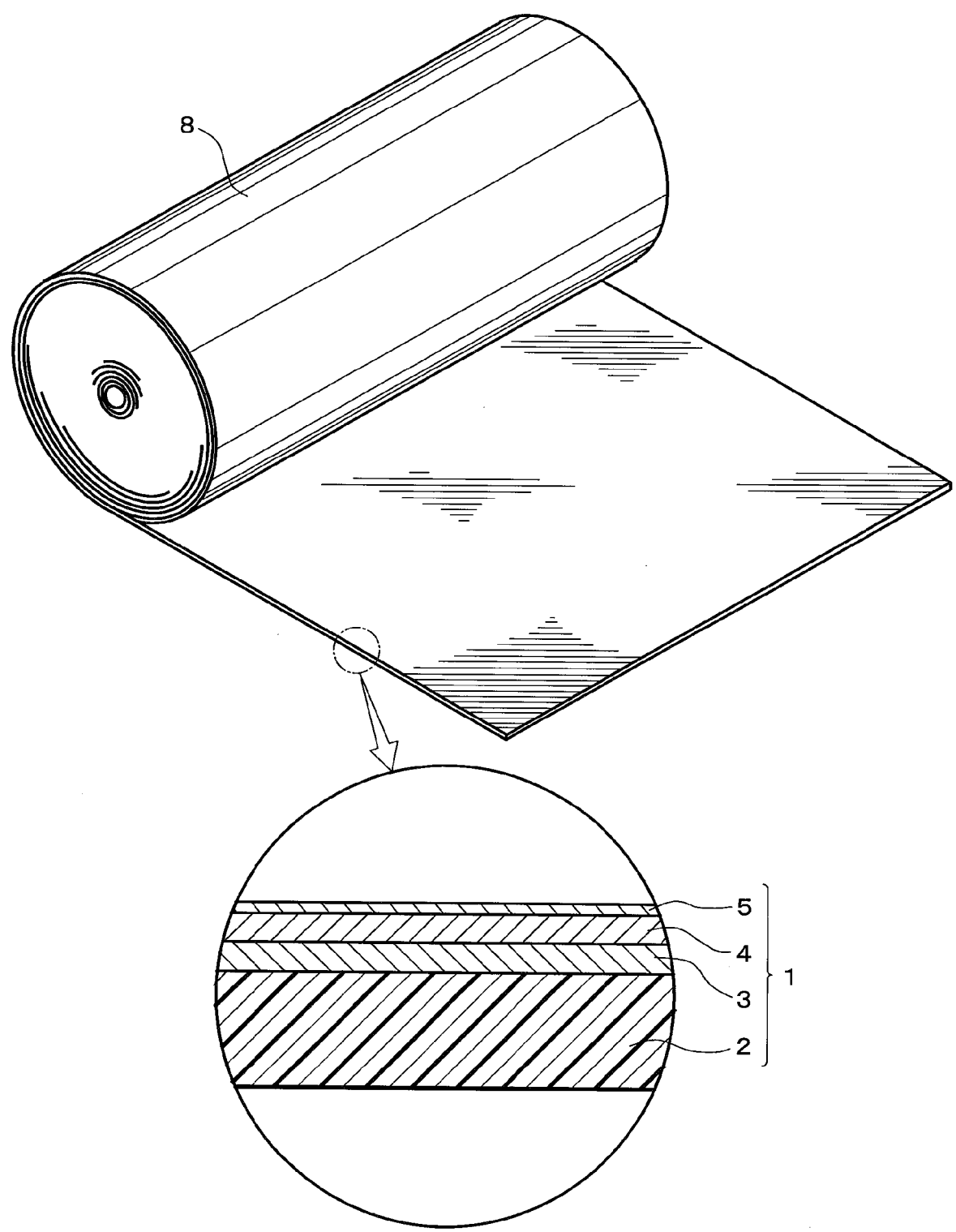
F I G. 1

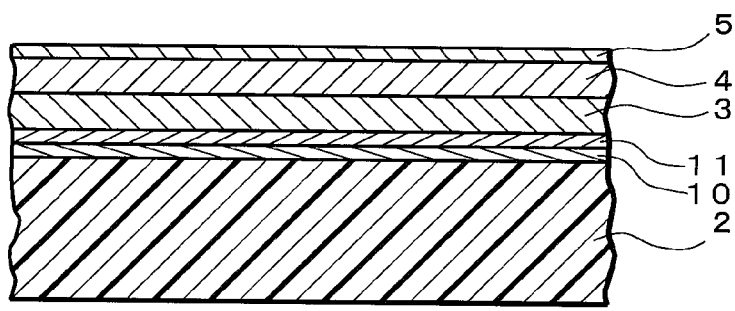
F I G. 2

CONDUCTIVE FILM

CROSS REFERENCE TO RELATED APPLICATIONS

This application claims the benefit of Japanese Patent Application No. 2012-176852, filed Aug. 9, 2012, which is hereby incorporated by reference in its entirety.

BACKGROUND

1. Technical Field

The present disclosure relates to a conductive film applicable to an input display unit capable of inputting information by a touch of a finger, the stylus pen, or the like.

2. Background

In the related art, a conductive film is known in which an indium tin oxide layer and a copper layer are laminated on a polyethylene terephthalate film (Japanese Laid-Open Patent Publication No. 2011-060146). The copper layer of the aforementioned conductive film is, for example, in order to manufacture a touch sensor applicable to a narrow bezel, processed to form a wiring at an outer peripheral portion of a touch panel screen (central window portion).

The aforementioned conductive film are occasionally stored for a long time in a rolled state before processing the copper layer, and in such a case, the aforementioned copper layer is oxidized naturally under the influence of oxygen in an atmosphere and an oxidized copper layer is formed in its surface. However, in a case where a film width of the conductive film is large to some extent, film characteristics may decrease since, when an oxidized copper layer is formed by natural oxidation, a difference in a degree of oxidation may be produced partially and the surface resistance value may vary in a width direction of the film.

It is an object of the present disclosure to provide a conductive film that has a smaller variation in the surface resistance value in the width direction and improved film characteristics.

SUMMARY

To achieve the above mentioned object, a conductive film according to an aspect of the present disclosure includes an elongated film base, a first conductive layer, a second conductive layer and a third conductive layer in this order, the elongated film base having a longitudinal direction and a width direction orthogonal to the longitudinal direction, the width direction dimension of the elongated film base is greater than or equal to 1 m, the first conductive layer being an indium-based oxide layer, the second conductive layer being a metal layer, the third conductive layer being an oxidized metal layer having a thickness of 1 nm to 15 nm formed by sputter deposition.

Preferably, the width direction dimension of the elongated film base is 1 m to 3 m.

More preferably, a surface resistance value of the conductive film is $0.\Omega/\square$ to $0.6\Omega/\square$.

Even more preferably, a surface resistance value of the conductive film is $0.3\Omega/\square$ to $0.6\Omega/\square$.

More preferably, a standard deviation of a surface resistance value in the width direction is less than or equal to $0.01\Omega/\square$.

Even more preferably, the standard deviation of a surface resistance value in the width direction is 0.001 to $0.005\Omega/\square$.

It is preferable that the third conductive layer is made of one of a copper oxide, a silver oxide, a silver oxide alloy and a titanium oxide alloy.

It is preferable that the second conductive layer is made of one of copper, silver, a silver alloy and a titanium alloy.

It is preferable that the second conductive layer has a thickness of 20 nm to 700 nm.

It is preferable that the first conductive layer is made of one of an indium tin oxide, an indium zinc oxide and a composite of indium oxide and zinc oxide.

It is preferable that the first conductive layer has a thickness of 20 nm to 80 nm.

It is preferable that the elongated film base has a thickness of 80 μm to 200 μm.

It is preferable that the elongated film base is made of polycycloolefin.

According to the present disclosure, a width direction dimension of the elongated film base is greater than or equal to 1 m, the first conductive layer is an indium-based oxide layer, the second conductive layer is a metal layer, and the third conductive layer is an oxidized metal layer of thickness 1 nm to 15 nm formed by sputter deposition. With this arrangement, in the conductive film having a width direction dimension of greater than or equal to 1 m, the surface resistance value in the width direction can be decreased and a conductive film having improved film characteristics can be provided.

BRIEF DESCRIPTION OF DRAWINGS

FIG. 1 is a perspective diagram showing a configuration of a conductive film according to an embodiment of the present disclosure.

FIG. 2 is a cross-sectional diagram showing a variant embodiment of the conductive film of FIG. 1.

DETAILED DESCRIPTION

Hereinafter, an embodiment of the present disclosure will be described in detail with reference to the accompanying drawings.

As shown in FIG. 1, a conductive film 1 of the present embodiment includes an elongated film base 2, an indium-based oxide layer 3 (first conductive layer), a metal layer 4 (second conductive layer), and an oxidized metal layer 5 (third conductive layer) in this order. The elongated film base 1 has a longitudinal direction and a width direction orthogonal to the longitudinal direction, and the width direction dimension of the elongated film is greater than or equal 1 m.

Concerning the conductive film 1, the oxidized metal layer 5 formed by sputter deposition is formed on a surface of the metal layer 4. Therefore, even if the conductive film is stored for a long term, no further oxidized metal layer is formed by natural oxidation. To the contrary to a case in which a thickness distribution of an oxidized metal layer formed by natural oxidation depends on a storage environment or condition of the conductive film in the atmosphere, a thickness distribution of an oxidized metal layer formed by sputter deposition is relatively constant, and therefore, a conductive film having a less variation in the surface resistance value in a width direction can be obtained.

The surface resistance value of the conductive film 1 of the present disclosure is preferably $0.1\ \Omega/\square$ to $0.6\ \Omega/\square$, and more preferably, $0.3\ \Omega/\square$ to $0.6\ \Omega/\square$. A standard deviation of the surface resistance value in the width direction of the conductive film 1 is preferably less than or equal to $0.01\ \Omega/\square$ and more preferably $0.001$-$0.005\ \Omega/\square$.

(1) Elongated Film Base Material

The elongated film base 2 as used herein has a longitudinal direction and a width direction orthogonal to the longitudinal direction. In the present disclosure, "elongated" means that a longitudinal direction dimension is sufficiently greater than a width direction dimension, and more preferably, the longitudinal direction dimension is greater than or equal to 10 times the width direction dimension.

The width direction dimension (hereinafter, simply referred to as "width") of the elongated film base 2 is greater than or equal to 1 m, and more preferably, 1 m to 3 m. The longitudinal direction dimension of the elongated film base (hereinafter, simply referred to as "length") is preferably greater than or equal to 1000 m. Under such condition, the conductive film of the present disclosure has an advantageous effect.

The elongated film base 2 is preferably a polycycloolefin film formed by extrusion. Since the polycycloolefin film formed by extrusion has a reduced amount of residual volatile matters, a harmful effect of a generated gas on each of the conductive layers can be decreased, and a surface resistance value of each of the conduction layer immediately after the film formation be made uniform. A water absorption rate of the polycycloolefin film obtained in conformity with a standard test method ASTM D570 (2010) is preferably less than or equal to 0.1%, and more preferably less than or equal to 0.05%.

Further, since the polycycloolefin film has a reduced amount of residual volatile matters, a thickness can be increased to improve the ease of handling. The thickness of the elongated film base 2 is preferably 80 µm-200 µm.

Note that the elongated film base 2 may be provided with an easy adhesive layer 10 on its surface to improve adhesiveness between the indium-based oxide layer 3 and the elongated film base 2, and may also be provided with an index-matching adjustment layer 11 for adjusting a reflectivity of the elongated film base 2 (FIG. 2). Alternatively, a hard coat layer (not shown) that makes it difficult for the surface of the elongated film base 2 to be damaged may be provided.

(2) Indium-Based Oxide Layer (First Conductive Layer)

For example, when the conductive film 1 of the present disclosure is used as a touch sensor, the indium-based oxide layer 3 used herein is used as a transparent conductive layer of a touch panel screen (central window portion).

A material forming the indium-based oxide layer 3 is preferably an indium tin oxide, an indium zinc oxide or a composite of indium oxide-zinc oxide due to good transparency and conductivity. A thickness of the indium-based oxide layer 3 is preferably 20 nm to 80 nm.

(3) Metal Layer (Second Conductive Layer)

For example, when the conductive film of the present disclosure is used as a touch sensor, the metal layer 4 used herein is used for forming an electric wiring at an outer peripheral portion of a touch panel screen (central window portion).

A material forming the metal layer 4 is, for example, copper, silver, a silver alloy or a titanium alloy. Since such material has a good electric conductivity, the electric wiring can be formed thinly. A thickness of the metal layer 4 is, for example, 20 nm to 700 nm.

(4) Oxidized Metal Layer (Third Conductive Layer)

The oxidized metal layer 5 used herein is a layer formed by sputter deposition and having a thickness of 1 nm to 15 nm. The oxidized metal layer 5 is provided for preventing the second conductive layer (metal layer) from being oxidized naturally under the influence of oxygen in the atmosphere.

A material forming the oxidized metal layer 5 is, for example, a copper oxide, a silver oxide, a silver oxide alloy or a titanium oxide alloy. From adhesiveness and corrosion-resistance points of view, it is desirable that a material forming the third conductive layer is an oxide of a metal material that is the same as the metal material forming the second conductive layer. For example, when the second conductive layer is a copper layer, the third conductive layer is preferably an oxidized copper layer.

In order to prevent natural oxidation, the thickness of the oxidized metal layer 5 is 1 nm to 15 nm, and preferably 3 nm to 10 nm.

The conductive film 1 configured as described above is manufactured by, for example, a method in which a roll of an elongated film base having a width of 1.1 m and a length of 500 m to 5000 m is placed in a sputtering device, and an indium composite oxide layer, a metal layer and an oxidized metal layer are formed sequentially by a sputtering method on one face of the elongated film base, while unwinding the roll at a constant speed.

The sputtering method is a method in which a cation in a plasma generated in low pressure gas is collided on a target material, which is a negative electrode, and a substance ejected from a surface of the target material is deposited on a substrate. In the sputtering device, fired targets of film forming materials are disposed so as to correspond to an order of lamination.

As has been described above, according to the present embodiment, the width direction dimension of the elongated film base 2 is greater than or equal to 1 m, the first conductive layer is the indium-based oxide layer 3, the second conductive layer is the metal layer 4, and the third conductive layer is the oxidized metal layer 5 having a thickness of 1 nm to 15 nm formed by sputter deposition. With such a configuration, in the conductive film 1 having a width direction dimension of greater than or equal to 1 m, the surface resistance value in the width direction thereof can be reduced and thus a conductive film of a high quality can be provided.

In the above description, the conductive film of the present embodiment has been described. However, the present disclosure is not limited to the embodiment described above, and various alterations and modifications can be made based on a technical concept of the present disclosure.

Examples of the present disclosure will now be described.

EXAMPLES

Example 1

First, on one side of an elongated film base made of a polycycloolefin film (manufactured by Zeon Corporation, product name "ZEONOR") formed by extrusion and having a width of 1.1 m, a length of 2000 m, and a thickness of 100 µm, an indium tin oxide layer having a thickness of 25 nm was formed as the first electrically conductive, a copper layer having a thickness of 50 nm was formed as the second conductive layer and an oxidized copper layer having a thickness of 7 nm was formed as the third conductive layer, sequentially by a sputtering method.

Example 2

A conductive film was manufactured in a manner similar to Example 1, except that the thickness of the oxidized copper layer was changed to 5 nm by changing a sputtering time.

Example 3

A conductive film was manufactured in a manner similar to Example 1, except that the thickness of the oxidized copper layer was changed to 1.5 nm by changing a sputtering time.

Comparative Example 1

A conductive film was manufactured in a manner similar to Example 1, except that the oxidized copper layer as the third conductive layer was not formed, and it was stored in the atmosphere of 23° C. for 72 hours and, an oxide membrane layer having a thickness of 1.7 nm was formed on a surface of the second electrically conducting (copper layer)

Then, each of the conductive films of Examples 1 to 3 and Comparative Examples 1 was measured and evaluated by the following method.

(1) Measurement of Thicknesses of First Conductive layer and Second Conductive layer Thicknesses of the indium tin oxide layer and the copper layer were measured by cross-sectional observation using a transmission electron microscope (manufactured by Hitachi, Ltd., H-7650).

(2) Measurement of Thickness of Third Conductive layer

Using an X-ray Photoelectron Spectroscopy analyzer device (manufactured by ULVAC-PHI, Inc, product name: "QuanteraSXM"), a thickness of the oxide copper layer was measured.

(3) Measurement and Evaluation of Surface Resistance Value

A surface resistance value of the obtained conductive film was measured at five points spaced apart by 15 cm in the width direction using a 4-point probe method and their standard deviation was obtained.

The results of measurement and evaluation of the conductive films of Examples 1 to 3 and Comparative Example 1 by the aforementioned methods (1) to (3), are shown in Table 1. Note that, in Table 1, a "thickness" in Examples 1 to 3 shows a thickness of the third conductive layer, and a "thickness" of Comparative Example 1 shows a thickness of the oxide membrane layer. [Table 1]

INDUSTRIAL APPLICABILITY

The conductive film of the present disclosure is, for example, cut into a display dimension and used in a touch sensor of, for example, a capacitance type.

What is claimed is:

1. A conductive film comprising:
an elongated film base, a first conductive layer, a second conductive layer and a third conductive layer in this order,
the elongated film base having a longitudinal direction and a width direction orthogonal to the longitudinal direction,
the width direction dimension of the elongated film base is greater than or equal to 1 m,
the first conductive layer being an indium-based oxide layer,
the second conductive layer being a metal layer,
the third conductive layer being an oxidized metal layer having a thickness of 1 nm to 15nm formed by sputter deposition,
wherein a surface resistance value is $0.1\Omega/\square$ to $0.6\Omega/\square$, and
a standard deviation of a surface resistance value in the with direction is less than or equal to $0.01\Omega/\square$.

2. The conductive film according to claim 1, wherein the width direction dimension of the elongated film base is 1m to 3m.

3. The conductive film according to claim 1, wherein a surface resistance value is $0.3\Omega/\square$ to $0.6\Omega/\square$.

4. The conductive film according to claim 1, wherein the standard deviation of a surface resistance value in the width direction is 0.001 to $0.005\Omega/\square$.

5. The conductive film according to claim 1, wherein the third conductive layer is made of one of a copper oxide, a silver oxide, a silver oxide alloy and a titanium oxide alloy.

6. The conductive film according to claim 1, wherein the second conductive layer is made of one of copper, silver, a silver alloy and a titanium alloy.

TABLE 1

| | THICKNESS | SURFACE RESISTANCE VALUE ($\Omega/\square$) | | | | | STANDARD DEVIATION | |
|---|---|---|---|---|---|---|---|---|
| | (mm) | 1 | 2 | 3 | 4 | 5 | ($\Omega/\square$) | DETERMINATION |
| EXAMPLE 1 | 7 | 0.52 | 0.52 | 0.52 | 0.52 | 0.51 | 0.002 | ○ (OK) |
| EXAMPLE 2 | 5 | 0.54 | 0.53 | 0.54 | 0.53 | 0.53 | 0.002 | ○ (OK) |
| EXAMPLE 3 | 1.5 | 0.58 | 0.57 | 0.57 | 0.57 | 0.57 | 0.004 | ○ (OK) |
| COMPARATIVE EXAMPLE 1 | 1.7 | 0.62 | 0.66 | 0.66 | 0.67 | 0.62 | 0.023 | X (NG) |

From the results shown in Table 1, as shown in Examples 1 to 3, in a conductive film having a width dimension of 1.1 m, when the thickness of the oxidized copper layer is 1.5 nm, 5 nm, and 7 nm, the standard deviation of the surface resistance value in the width direction is 0.002 to 0.004 $\Omega/\square$, and it can be seen that it shows a good surface resistance value with a small variation. On the other hand, as shown in Comparative Example 1, in the conductive film having a width dimension of 1.1 m, when an oxide membrane layer having a thickness of 1.7 nm is formed by natural oxidation, the standard deviation of the surface resistance value in the width direction was $0.023\Omega/\square$, and it was found that variation was large.

7. The conductive film according to claim 6, wherein the second conductive layer has a thickness of 20 nm to 700 nm.

8. The conductive film according to claim 1, wherein the first conductive layer is made of one of an indium tin oxide, an indium zinc oxide and a composite of indium oxide and zinc oxide.

9. The conductive film according to claim 8, wherein the first conductive layer has a thickness of 20 nm to 80 nm.

10. The conductive film according to claim 1, wherein the elongated film base has a thickness of 80 μm to 200 μm.

11. The conductive film according to claim 10, wherein the elongated film base is made of polycycloolefin.

* * * * *